(12) United States Patent
Ortiz et al.

(10) Patent No.: US 10,753,992 B2
(45) Date of Patent: Aug. 25, 2020

(54) MRI SYSTEM WITH AUTOMATIC POSITIONING OF RADIO-FREQUENCY COIL BASED UPON WIRELESS SIGNAL AND METHOD OF OPERATION THEREOF

(71) Applicant: KONINKLIJKE PHILIPS N.V., Eindhoven (NL)

(72) Inventors: Timothy Ortiz, Gainsville, FL (US); George Randall Duensing, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 101 days.

(21) Appl. No.: 15/772,250

(22) PCT Filed: Oct. 28, 2016

(86) PCT No.: PCT/IB2016/056494
§ 371 (c)(1),
(2) Date: Apr. 30, 2018

(87) PCT Pub. No.: WO2017/077435
PCT Pub. Date: May 11, 2017

(65) Prior Publication Data
US 2018/0313919 A1   Nov. 1, 2018

Related U.S. Application Data

(60) Provisional application No. 62/251,292, filed on Nov. 5, 2015.

(51) Int. Cl.
*G01R 33/36* (2006.01)
*G01R 33/54* (2006.01)
*G01R 33/341* (2006.01)

(52) U.S. Cl.
CPC ....... *G01R 33/3692* (2013.01); *G01R 33/543* (2013.01); *G01R 33/341* (2013.01)

(58) Field of Classification Search
CPC . G01R 33/3692; G01R 33/543; G01R 33/341
See application file for complete search history.

(56) References Cited

U.S. PATENT DOCUMENTS

| | | | | |
|---|---|---|---|---|
| 7,852,081 B2* | 12/2010 | Arnold | ............... | G01R 33/3415 324/318 |
| 8,754,644 B2* | 6/2014 | Trakic | .................. | G01R 33/422 324/307 |
| 2003/0132750 A1* | 7/2003 | Machida | ............ | G01R 33/3415 324/322 |
| 2003/0184292 A1* | 10/2003 | Meyer | ................ | G01R 33/3415 324/309 |

(Continued)

*Primary Examiner* — Dixomara Vargas

(57) ABSTRACT

A magnetic resonance (MR) system includes a main magnet having a bore and producing a substantially homogenous magnetic field ($B_0$) within a scanning volume. A mobile radio-frequency (RF) coil (MRF) includes at least one transmit antenna for transmitting a location signal within the bore of the magnet. At least one receive antenna os situated substantially at a known location and configured to receive the transmitted location signal. A controller is configured to align the transmit antenna of the MRF with reference to the known location of the receive antenna based upon an analysis of the received location signal.

20 Claims, 9 Drawing Sheets

(56) References Cited

U.S. PATENT DOCUMENTS

| | | | |
|---|---|---|---|
| 2005/0253584 A1* | 11/2005 | Campagna | G01R 33/3415 324/318 |
| 2007/0103157 A1* | 5/2007 | Campagna | A61B 5/055 324/318 |
| 2008/0015430 A1* | 1/2008 | Takamori | G01R 33/307 600/415 |
| 2008/0211503 A1* | 9/2008 | Arnold | G01R 33/3415 324/318 |
| 2010/0052682 A1 | 3/2010 | Mueller | |
| 2010/0156421 A1* | 6/2010 | Sukkau | G01R 33/3415 324/318 |
| 2010/0176800 A1* | 7/2010 | Biber | G01R 33/341 324/207.13 |
| 2010/0259262 A1* | 10/2010 | Ichinose | G01R 33/3415 324/309 |
| 2010/0289492 A1* | 11/2010 | Biber | G01R 33/28 324/307 |
| 2012/0319689 A1* | 12/2012 | Ichinose | G01R 33/3664 324/322 |
| 2013/0165767 A1 | 6/2013 | Darrow et al. | |
| 2013/0181715 A1 | 7/2013 | Biber | |
| 2014/0055127 A1* | 2/2014 | Biber | G01R 33/3692 324/207.11 |
| 2015/0084626 A1* | 3/2015 | Paul | G01R 33/481 324/307 |
| 2015/0253404 A1 | 9/2015 | Tomiha et al. | |
| 2015/0293188 A1* | 10/2015 | Haider | G01R 33/34007 324/307 |
| 2016/0178713 A1* | 6/2016 | Fischer | G01R 33/36 324/322 |
| 2018/0210052 A1* | 7/2018 | Ham | G06T 11/005 |

* cited by examiner

MRI SYSTEM WITH AUTOMATIC POSITIONING OF RADIO-FREQUENCY COIL BASED UPON WIRELESS SIGNAL AND METHOD OF OPERATION THEREOF

CROSS REFERENCE TO RELATED APPLICATIONS

This application is a U.S. national phase application of International Application No. PCT/1132016/056494, filed on Oct. 28, 2016, which claims the benefit of U.S. provisional Application Ser. No. 62/251,292 filed on Nov. 5, 2015, which is incorporated herein by reference.

BACKGROUND

The present system relates to system for positioning a radio-frequency (RF) coil for magnetic resonance (MR) imaging (MRI) and spectroscopy (MRS) systems and, more particularly, to a positioning system which can control position of an RF coil for MRI and/or MRS systems and a method of operation thereof.

Mobile RF coils have recently become commonplace in MRI and MRS systems. Mobile RF coils may communicate with an MRI system controller using any suitable method such as a wireless communication method. Wireless RF coils are positioned during each use and may employ wireless communication methods to communicate with other portions of an MRI system such as a system controller. In prior systems when the coils had a fixed relation to the rest of the system, the position of the fixed coils may be optimized to improve scan quality. Unfortunately, it is difficult to optimize image quality for a coil that has no fixed relation to the rest of the MRI system since it is difficult to properly position mobile RF coils when performing scans within a bore of a main magnet. As should be clear, changes in the positioning of the mobile RF coils may lead to diminished image quality. Accordingly, embodiments of the present system may overcome these and/or other disadvantages of prior art systems.

SUMMARY

The system(s), device(s), method(s), arrangements(s), user interface(s), computer program(s), processes, etc. (hereinafter each of which are referred to as system, unless the context indicates otherwise), described herein address problems in prior art systems.

In accordance with embodiments of the present system, there is disclosed a magnetic resonance (MR) system, comprising: a main magnet having a bore and producing a homogenous magnetic field (B0) within a scanning volume; a mobile radio-frequency (RF) coil (MRF) including at least one transmit antenna for transmitting a location signal within the bore of the magnet; at least one receive antenna situated at a known location, the receive antenna configured to receive the transmitted location signal; and a controller configured to align the transmit antenna of the MRF with reference to the known location of the receive antenna based upon an analysis of the received location signal. The controller may include at least one base transceiver system (BTS) each coupled to corresponding ones of the at least one receive antenna.

In accordance with embodiments of the present system, the controller may be configured to determine at least one of a receive signal strength (RSSI) of the transmitted signal and a distance (d) between the transmit antenna and the receive antenna. The receive antenna may be situated substantially at an isocenter axis (ISO) of the scanning volume and the controller may be configured to determine a receive signal strength (RSSI) for each of a plurality of positions of the transmit antenna along a z axis perpendicular or substantially perpendicular to the ISO. The controller may be configured to determine, for the plurality of positions of the transmitting antenna, a maxima of the RSSI. The controller may be configured to determine a position along the z axis that corresponds with the RSSI at the maxima and/or to control at least one actuator of a support portion to locate the transmit antenna substantially on the ISO. The receive antenna may be situated substantially at an isocenter axis (ISO) of the scanning volume and the controller may be configured to control at least one actuator of a support portion to locate the transmit antenna substantially on the ISO based upon the determined distance (d).

In accordance with embodiments of the present system, there is disclosed a method of operating a magnetic resonance (MR) system comprising acts of: producing a substantially homogenous magnetic field (B0) within a scanning volume of a bore; transmitting by a mobile radio-frequency (RF) coil (MRF) including at least one transmit antenna a location signal within the bore; receiving by at least one receive antenna situated at a known location the transmitted location signal; and aligning by a controller the transmit antenna of the MRF with reference to the known location of the receive antenna using the received location signal. The method may include an act of determining by the controller at least one of a receive signal strength (RSSI) of the transmitted signal and a distance (d) between the transmit antenna and the receive antenna. Wherein the receive antenna is situated substantially at an isocenter axis (ISO) of the scanning volume, the method may include one or more acts of the controller including determining a receive signal strength (RSSI) for a plurality of positions of the transmit antenna along a z axis perpendicular or substantially perpendicular to the known location, determining a maxima of the RSSI for the plurality of positions of the transmitting antenna and/or determining a position along the z axis that corresponds with the RSSI at the maxima.

In accordance with embodiments of the present system, the method may include an act an act of the controller controlling at least one actuator of a support portion to locate the transmit antenna substantially at the determined position. Wherein the receive antenna is situated substantially at an isocenter axis (ISO) of the scanning volume, the method may include an act of controlling at least one actuator of a support portion to locate the transmit antenna substantially on the ISO based upon the determined distance (d).

In accordance with embodiments of the present system, there is disclosed a computer readable non-transitory memory medium for a magnetic resonance (MR) system including a main magnet having a bore and producing a homogenous magnetic field (B0) at an isocenter axis (ISO) within a scanning volume, the computer program comprising computer program instructions that when executed by a processor cause the processor to perform a method comprising acts of: transmitting by a mobile radio-frequency (RF) coil (MRF) including at least one transmit antenna a location signal within the bore; receiving by at least one receive antenna situated substantially on the ISO the transmitted location signal; and aligning the transmit antenna of the MRF with reference to the ISO using the received location signal.

Further acts of the processor may include one or more of determining at least one of a receive signal strength (RSSI)

of the transmitted signal and a distance (d) between the transmit antenna and the receive antenna, determining a receive signal strength (RSSI) for a plurality of positions of the transmit antenna along a z axis perpendicular or substantially perpendicular to the ISO, determining a maxima of the RSSI for the plurality of positions of the transmitting antenna, determining a position along the z axis that corresponds with the RSSI at the maxima and/or controlling at least one actuator of a support portion to locate the transmit antenna substantially at the determined position.

BRIEF DESCRIPTION OF THE DRAWINGS

The present invention is explained in further detail in the following exemplary embodiments and with reference to the figures, where identical or similar elements are partly indicated by the same or similar reference numerals, and the features of various exemplary embodiments being combinable. In the drawings.

DETAILED DESCRIPTION

The following are descriptions of illustrative embodiments that when taken in conjunction with the following drawings will demonstrate the above noted features and advantages, as well as further ones. In the following description, for purposes of explanation rather than limitation, illustrative details are set forth such as architecture, interfaces, techniques, element attributes, etc. However, it is apparent to those of ordinary skill in the art that other embodiments that depart from these details would still be understood to be within the scope of the appended claims. Moreover, for the purpose of clarity, detailed descriptions of well-known devices, circuits, tools, techniques, and methods are omitted so as not to obscure the description of the present system. It should be expressly understood that the drawings are included for illustrative purposes and do not represent the entire scope of the present system. In the accompanying drawings, like reference numbers in different drawings may designate similar elements. The term and/or and formatives thereof should be understood to mean that only one or more of the recited elements may need to be suitably present (e.g., only one recited element is present, two of the recited elements may be present, etc., up to all of the recited elements may be present) in a system in accordance with the claims recitation and in accordance with one or more embodiments of the present system.

Figure 1:
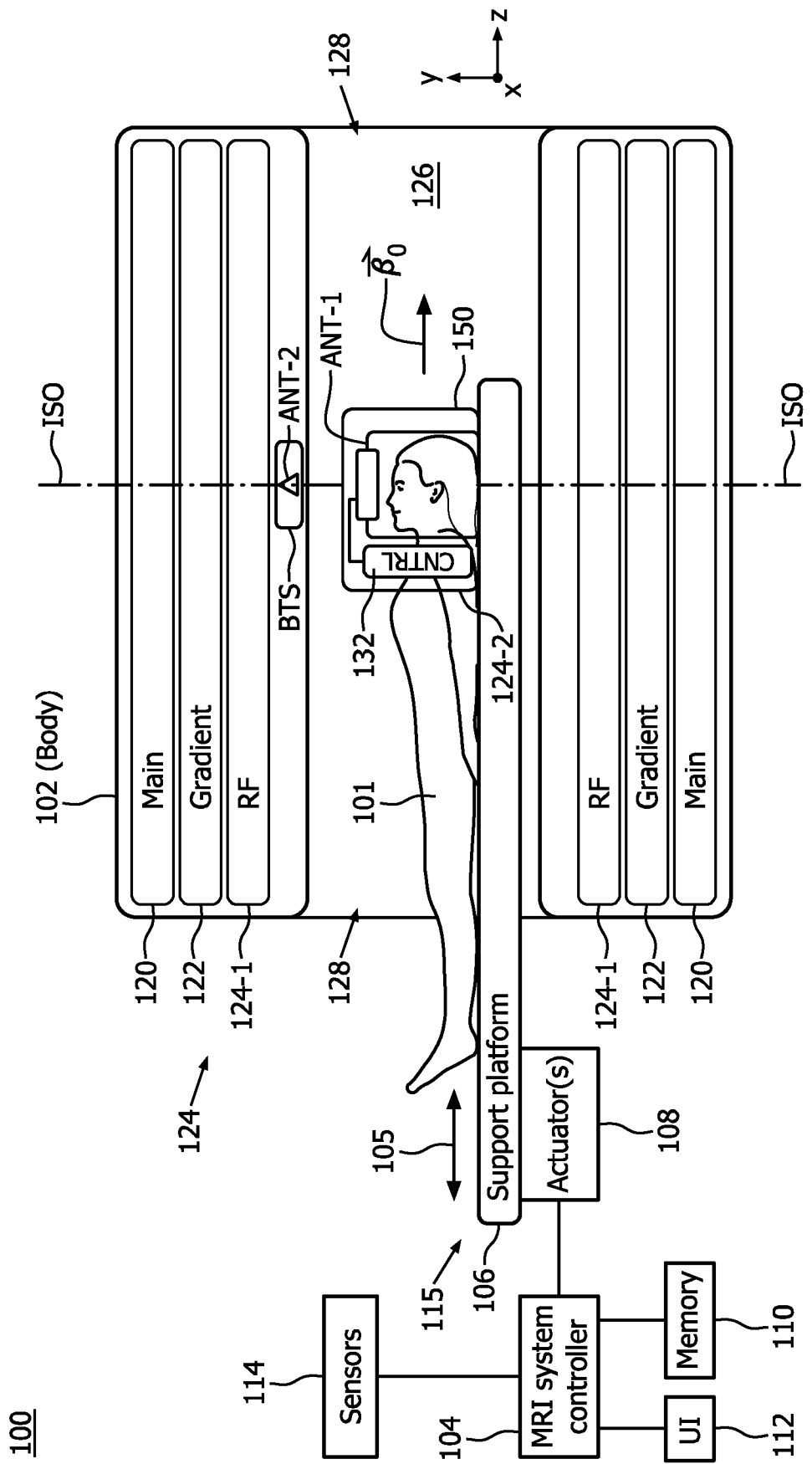
FIG. 1 shows a schematic block diagram of a portion of an MR system in accordance with embodiments of the present system.

FIG. 1 shows a schematic block diagram of a portion of an MR system 100 (hereinafter system 100 for the sake of clarity) in accordance with embodiments of the present system. The system 100 may include one or more of a body 102, an MRI system controller 104, a support portion 115, a memory 110, a user interface (UI) 112, and sensors 114.

The body 102 may include one or more of a main magnet 120 having a bore 126 (e.g., a main bore), gradient coils 122, and an RF coils 124 one or more of which may operate under the control of the controller 104. The body 102 may include an open—or closed—type MRI body (e.g., corresponding with open-type or closed-type MRI systems, respectively). For the sake of clarity, a closed—type MRI body (e.g., having the scanning volume located within the bore 126), is illustratively discussed herein. In accordance with the present invention, the illustrative example of a closed MRI is discussed herein however is understood to apply to an open MRI embodiment, as applicable, without further elaboration unless noted. The body 102 may further include at least one opening 128 which may lead to the bore 126.

The main magnet 120 may include one or more main magnets which may generate a main magnetic field ($B_0$) which may be homogeneous, such as substantially homogeneous (e.g., mostly homogeneous and/or within reasonable engineering tolerances) within a scanning volume and may be controlled by the controller 104. The scanning volume may be situated within the bore 126. As readily appreciated, in open-type MRI systems the scanning volume may be located outside of a bore of a main magnet.

The gradient coil 122 may include at least one coil which may generate gradient one or more fields (e.g., gradient excitation pulses) along one or more axes (e.g., $G_x$, $G_y$, and $G_z$) under the control of the controller 104. These gradient fields may form at least part of an encoding sequence that may be applied within at least the scanning volume to the patient.

In accordance with embodiments of the present system, a base transceiver station (BTS) may include one or more antennas (ANT-$2_n$) positioned along known positions within the body 102. As utilized herein, substantially at a known position (e.g., substantially at the isocenter axis) means within reasonable engineering tolerances of that known position. For example an antenna ANT-2 may be located at or substantially at an isocenter axis (ISO) of the main magnetic field ($B_0$) of the system 100. For the sake of clarity, this antenna may be referred to as a receive antenna. As readily appreciated, in accordance with further embodiments of the present system, the ANT-2 may be located in other locations with reference to the isocenter axis. For the sake of clarity, only the antenna ANT-2 is discussed herein though as appreciated, the discussion herein may apply to two or more receive antennas ANT-$2_n$ as illustratively discussed herein with reference to FIG. 7.

The isocenter axis (ISO) may be defined as an axis or plane which may be substantially normal to the main magnetic field ($B_0$) of the system 100. The ISO center is well defined location within the system determined by the physical size and symmetry of the system design and typically is the area of highest magnetic field homogeneity. The BTS may be located at, or adjacent to, the bore 126 of the main magnet 120. For example, in accordance with embodiments of the present system, the BTS may be coupled to an interior surface of the body 102 within the main bore 126 or may be part of the controller 104. The BTS may be coupled to the controller 104 using any suitable method so as to communicate with the controller 104. For example, the receive antenna ANT-2 of the BTS may receive a location signal (e.g. that is transmitted from a wireless type RF coil via an ANT-1 as are described below) and may provide this signal to the controller 104. In accordance with embodiments of the present system, the controller 104 may for example determine receive signal strength (RSSI) of the received location signal as described with reference to FIG. 2 below.

In accordance with embodiments of the present system, the received signal strength may be optimized (e.g., one or more of amplitude, frequency, timing, modulation, etc.) for RSSI measurements. It should be noted that the RSSI measurements are capable for example for both transmit and/or receive (TRX) at ANT-1 and ANT-2. Further, multiple signals may travel through these one or more antennas including data signal streams, clock information and control information, for example.

The RF portion 124 may include one or more of transmit and/or receive (TRX) RF coil 124-1 and an RF coil such as a mobile RF coil (MRF) 124-2. One or more of these coils (124-1 and 124-2) may be used depending upon system settings.

The TRX RF coil 124-1 may receive an RF sequence signals for transmission from the controller 104 and may emit corresponding RF fields (e.g., RF excitation pulses which may form part of an RF encoding sequence which may form part of the encoding sequence). The TRX RF coil 124-1 may further receive induced MR signals from the 001 and may provide these signals to the controller (e.g., in raw or processed form) and/or may process these signals to reconstruct image data and provide the reconstructed image information to the controller 104 for further processing. The TRX RF coil 124-1 may include fixed and/or mobile coils.

The MRF 124-2 may include any suitable mobile coil or coils such as a wireless-type digital RF coil that may be mobile. The location of the mobile coil may be directly or indirectly controlled by the controller 104. The MRF 124-2 may be coupled to, or otherwise rest upon, the support portion or portions thereof such as a support platform 106 (e.g., a patient support) as discussed herein. However, it is also envisioned that the MRF 124-2 may be coupled to rails which and/or to the user 101 during operation. For example, when operating as a volume coil such as head, knee, shoulder coil, etc., the MRF 124-2 may rest upon the support platform 106 and surround a corresponding body part of the patient 101 that is to be scanned (e.g., a knee, a head, a shoulder, etc.). The rails may be situated within the bore 126 and may be parallel to the main magnetic field ($B_0$) or z axis as shown. The MRF 124-2 may include planer- and/or volume-type RF coils which may include one or more coil arrays that may include one or more receive loops tuned to receive induced MR signals from the 001 and generate corresponding signals for further processing. The MRF 124-2 may include one or more channels (CH) each of which may be associated with a corresponding receive loop or loops of the coil array.

The MRF 124-2 may include one or more of a controller 132, an RF coil array, a memory, and a transmit antenna ANT-1 (e.g., a transmission antenna). In accordance with embodiments of the present system, the controller 132 may control the overall operation of the MRF 124-2. The MRF 124-2 may receive induced MR signals from the 001 such as the patient 101 (hereinafter both of which may be referred to as the patient 101 for the sake of clarity) and may reconstruct these signals to generate reconstructed MR information which may include, for example, image and/or spectrographic information. The reconstructed MR information may then be provided to the controller 104. However, it is also envisioned that the MRF 124-2 may provide signals related to the induced MR signals in any suitable format (e.g., raw digitized, etc.) to the controller 104 for further processing and/or reconstruction. Thus, reconstruction may be performed locally in the MRF 124-2 and/or remotely from the MRF 124-2.

In accordance with embodiments of the present system, the MRF 124-2 may communicate with the controller 104 using any suitable link or links such as a wired, optical, and/or wireless links. However, for the sake of clarity, it are assumed that the MRF 124-2 may communicate with the controller 104 using any suitable wireless link (WL). For example, the controller 132 may communicate with the controller 104 via antennas ANT-1 and ANT2. In accordance with embodiments of the present system, the RSSI capability of the WL Physical and media access control (MAC) may not be the primary function of the WL or TRX. The support portion 115 may include a support platform 106 and at least one actuator 108 that may control a position of the support platform 106.

The support portion 106 may support the patient 101 for scanning and may be positioned by the at least one actuator 108 under the control of the controller 104. Accordingly, the support portion 106 may position the patient and the MRF 124-2 in a desired position and/or orientation such as within an isocenter of an MR field within the bore 126 of the magnet 120 under the control of the controller 104 such that at least a portion of the patient 101 may be scanned.

In accordance with embodiments of the present system, the at least one actuator 108 may include any suitable motivation source such as electric motors (e.g., linear, rotational, stepper, etc.), pneumatic actuators, and/or hydraulic actuators which may position the support portion 106 in a desired location. For example, at least one actuator 108 may move the support portion 106 along the z axis as illustrated by arrow 105 under the control of the controller 104. The controller 104 may control the overall operation of the system 100 in accordance with embodiments of the present system. The controller 104 may control the at least one actuator 108 to position the support platform in accordance with embodiments of the present system. The controller 104 may further generate RF sequence signals and provide these sequences to the RF portion 124.

During operation, the controller 104 may be operative to generate an encoding sequence that may be applied to the patient 101 within the scanning volume (SV). In response to application of the encoding sequence (which may include the gradient and/or the RF excitation pulses), the patient 101 may emit MR signals which may be received by the RF portion 124 such as by the MRF 124-2. The sensors 114 may sense various conditions and/or parameters of the system such as location of the support platform 106, position of the at least one actuator 108, system parameters, etc. For example, the sensors 114 may include location sensors which may sense location of the support platform relative to a fixed reference (e.g., the isocenter axis (ISO) and provide this information to the controller 104 for further processing.

Figure 2:
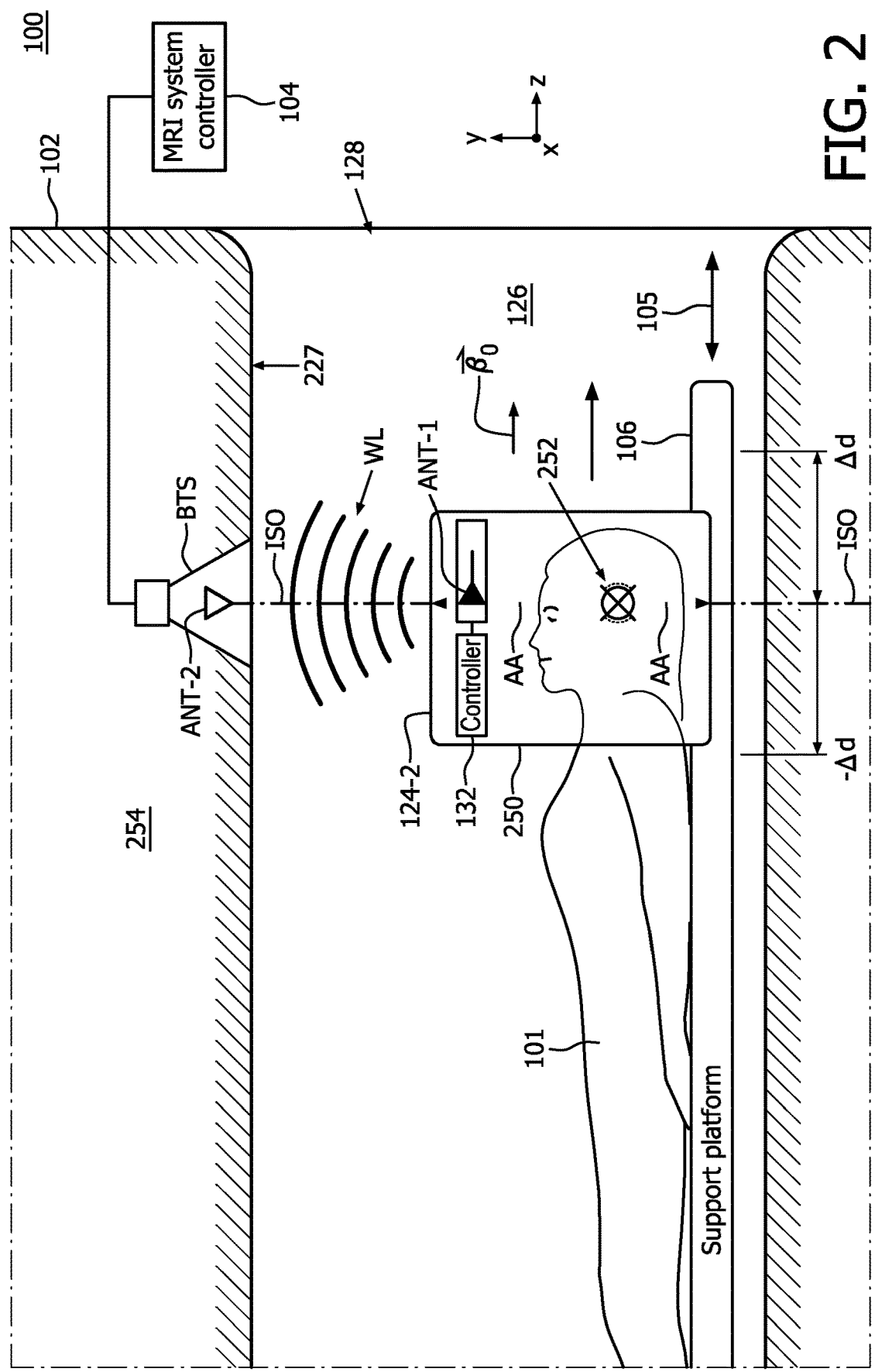
FIG. 2 shows a detailed schematic block diagram of a portion of the MR system similar to that shown in FIG. 1 in accordance with embodiments of the present system.

FIG. 2 shows a detailed schematic block diagram of a portion of the MR system 100 similar to that shown in FIG.

1 in accordance with embodiments of the present system. The MRF 124-2 may communicate with the BTS using the WL. The antenna ANT-2 of the BTS may be located at a desired location such as at, or substantially at, the isocenter axis (ISO) of the main magnetic field $B_0$ of the system 100. For example, in accordance with embodiments of the present system the ANT-2 may be located within a cavity 254 of the body (e.g., see, 102) of the system 100 at, or substantially at, the isocenter axis (ISO). However, it is also envisioned that the ANT-2 may be located at the ISO center using other methods. For example, it is envisioned that the ANT-2 may be coupled to an interior wall 227 of the bore 126.

The antenna ANT-1 of the MRF 124-2 may be located at a desired location relative to a desired object to be scanned such as a desired location of the body 250 and/or one or more coil arrays (e.g. which receive induced MR signals) of the MRF 124-2. The MRF 124-2 may include a landmark 252 (e.g., an "X" within a circle (as shown), an arrow, etc. as may be desired) which may be aligned with a desired portion of the patient 101 that is desired to be scanned. The antenna ANT-1 may be aligned with the landmark 252 such that when the ANT-1 is aligned with the isocenter axis (ISO), the desired portion of the patient 101 that is to be scanned may be scanned at the isocenter axis (ISO). This may enhance image quality of reconstructed information.

In accordance with embodiments of the present system, two processes to align or otherwise locate a transmit antenna (e.g., ANT-1) relative to a receive antenna (e.g., ANT-2) are described with reference to FIGS. 3 and 4. The first process is described with reference to the process of FIG. 3A and may determine a distance d between the transmit and the receive antennas and adjust a position of an MRF (e.g., 124-2) based upon the determined distance d. The second process is described with reference to FIG. 4 and may adjust a position of an MRF based upon RSSI and may be independent of d.

Figure 3A:
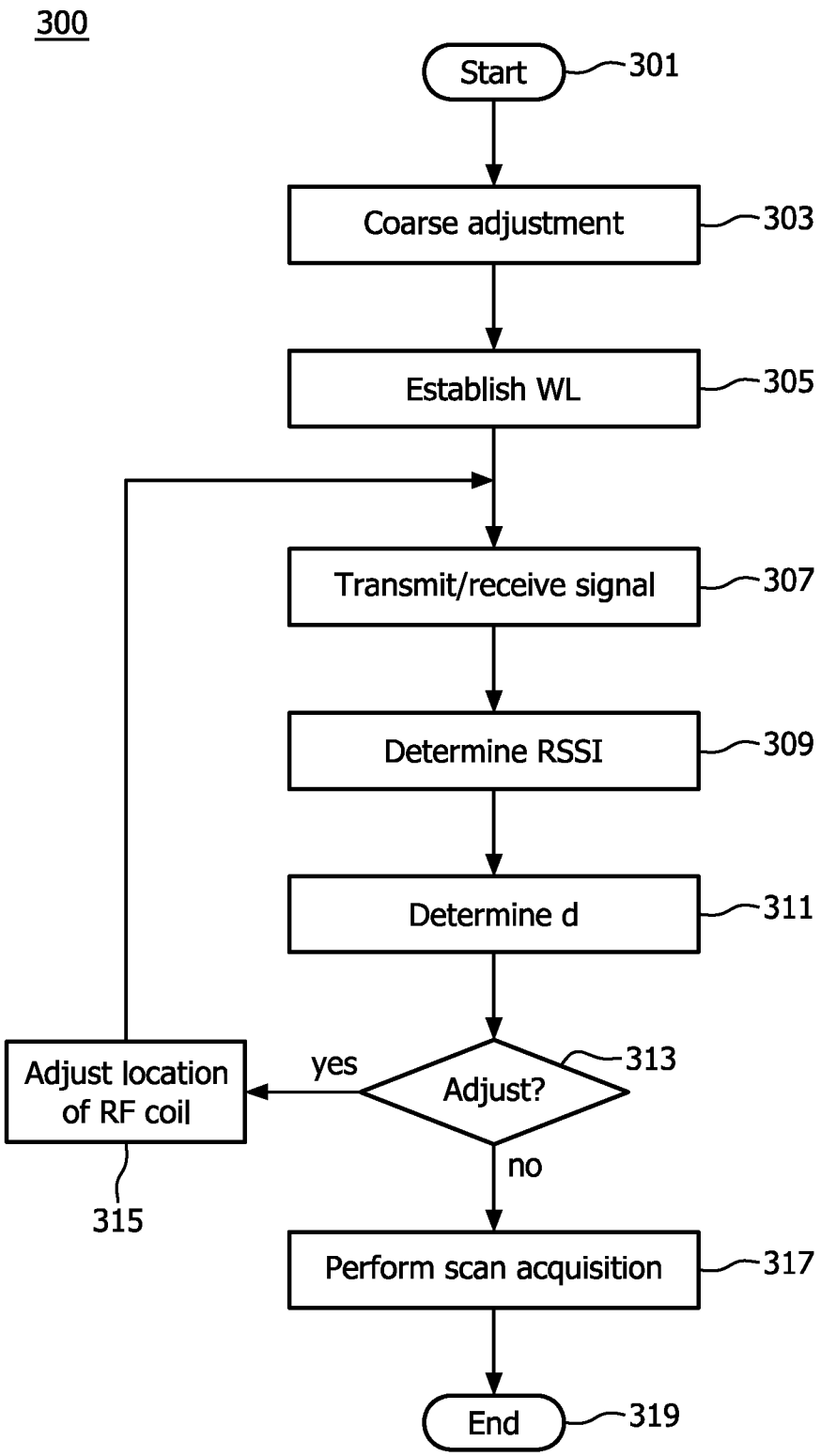
FIG. 3A shows a functional flow diagram of a process that may be performed in accordance with embodiments of the present system.

Referring to FIG. 3A, this figure shows a functional flow diagram of a process 300 that may be performed in accordance with embodiments of the present system. The process 300 may be performed using one or more computers communicating over a network and may obtain information from, and/or store information to one or more memories which may be local and/or remote from each other. The process 300 may include one or more of the following acts and may be operative to align and/or otherwise locate antennas of a transmit/receive system of an MRI system that may include one or more of an MRF and BTS. Further, one or more of these acts may be combined and/or separated into sub-acts, if desired. Further, one or more of these acts may be skipped depending upon settings. In operation, the process may start during act 301 and then proceed to act 303.

During act 303, the process may perform a coarse adjustment operation to place a support platform in an initial location within a bore of a main magnet such that the MRF, or portions thereof, is near an isocenter axis (ISO) of main magnet of an MRI system. The process may perform this act autonomously and/or under control of a user (such as a clinician performing the scan). For example, the process may autonomously control at least one actuator to advance the support platform to an initial location within the bore of the main magnet (e.g., see, FIG. 1, 126). This initial location may be determined using any suitable placement method such as by using optical methods (e.g., using an optical guidance method), for example calibrated by finding a max RSSI value and/or using a Cartesian coordinate system.

For example, the system may determine the initial location based upon a type of scan being performed (e.g., head, knee, etc.) and/or location of a landmark relative to the support platform (e.g. landmark at 33 inches from reference point of support platform). Accordingly, in a case where a knee scan is being performed, the support platform may be advanced to a first initial location (e.g., relative to the body 102 or portions thereof (e.g., the bore 126)) while in a case where a head scan is being performed, the support platform may be advanced to a second initial location. In accordance with embodiments of the present system, based upon the position of the landmark (or landmarks) relative to the support platform, these initial locations may be modified to fit a desired reference frame. After completing act 303, the process may continue to act 305.

A fine positioning process in accordance with embodiments of the present system is described with reference to acts 305 through 315. During act 305, the process may establish the WL communicatively coupling a wireless RF coil via an antenna of the RF coil such as ANT-2 to a BTS via an antenna of the BTS such as ANT-2 located at a desired position such as at, or substantially at, an isocenter axis (ISO) of the main magnet. In accordance with embodiments of the present system and to simplify the discussion herein, the WL, antenna gain of the transmit antenna and the receive antenna as well as the transmit power may be set to, or otherwise equal to values which may be considered to be constant throughout the process. As readily appreciated, the antenna gain of the transmit antenna and the receive antenna as well as the transmit power may not be constant but may be otherwise known and thereby may be compensated for operation throughout the process.

Values of antenna gain and/or transmit power may be stored in a memory of the system for later use and may be dependent upon a type of scan (e.g., knee, head, etc.) and/or a type of coil (e.g. a type (or types) of MRF) being used for the scan. However, in a case where the antenna gain (e.g., for the transmit antenna (ANT-1), the receive antenna (ANT-2), and/or the transmit power is fixed based upon the hardware used, the process may determine these values from a memory of the system and/or through a calibration process to determine these values. After completing act 305, the process may continue to act 307.

During act 307, the process may transmit a signal (e.g., a location signal) from transmit antenna to the receive antenna over the WL. In other words, the process may transmit the signal from the MRF via its antenna (e.g., ANT-1) to the antenna (e.g., ANT-2) of a BTS (BTS). The signal may include any suitable signal such as pilot tone signal, system clock, preamble, header information and/or MRF information like coil ID, etc. For example, in accordance with embodiments of the present system, the location signal may include image information (e.g., reconstructed and/or non-reconstructed) of a current scan. In accordance with some embodiments, the WL may be established by transmitting the location signal which may be received by the receiving antenna. After completing act 307, the process may continue to act 309. During act 309, the process may determine RSSI of the received signal. The determination (e.g., of RSSI) may be performed locally by the BTS and/or by a system controller. In a case wherein the BTS determines RSSI, it may then provide the RSSI to the controller.

For the sake of clarity, herein the BTS is discussed generally as a portion of the controller device. However, it should be appreciated that the BTS may be a separate device from the controller device in accordance with some embodiments of the present and/or may be a portion of the controller device in accordance with other embodiments of the present system. Accordingly, the discussion herein should generally be understood to apply to all applicable embodiments.

The RSSI may be a function of one or more of path loss of the wireless link (WL), the transmit power of the transmit antenna (e.g., ANT-1 of the MRF 124-2), and the gain of each of the transmit antenna and the receive antenna (e.g., ANT-1 and ANT-2, respectively, in the present embodiments). For a given design, antenna gain of the transmit antenna and the receive antenna may be set to a known constant and the transmit power can be set to a known constant level. Accordingly, a variation of RSSI may then be determined by a free-space path loss (FSPL) of the wireless link (WL). The FSPL may be defined as set forth as:

$$FSPL\ (dB) = (4\pi df/c)^2 \qquad \text{Equation (1),}$$

where d is a distance between the transmit antenna and the receive antenna, f is transmission frequency of a signal used in the WL (e.g. of a location signal or signals transmitted from the transmit antenna of the MRF and received by the receive antenna of the BTS), and c is the speed of light. Then, for any given frequency f the FSPL may be determined by distance d alone.

In another embodiment FSPL may be defined as:

$$FSPL\ (dB) = Pr(d)/(P(t)GtGr,$$

where $Pr(d)$=power received which is measured RSSI, $P(t)$=Known TX power, $Gt$=TX antenna gain which is a constant, and $Gr$=RX antenna gain which is a constant.

In any event, as the transmit antenna and the receive antenna move generally parallel to each other, and are in line-of-sight of each other, the RSSI may be simplified to be a function of a path loss exponent n which indicates how the path loss increases with distance and a distance d between the transmit antenna and the receive antenna as illustrated in Equation 2 below.

$$RSSI\ (dBm) = A - 10n \cdot Log(d) \qquad \text{Equation (2),}$$

then, $$Log(d) = RSSI\ (dBm)/(A - 10n) \qquad \text{Equation (3), and}$$

$$d = \sqrt{(RSSI\ (dBm)/(A - 10n))} \qquad \text{Equation (4).}$$

A & n are constants that define the quantitative model which predicts the effects of the environment which in accordance with embodiments of the present system may be the system bore (e.g., bore 126). For example, for free space n=2 and for office space line of sight n=1.8:

$$n = (PL(di) - PL(do))/10\ Log(di/do),$$

where do=reference distance and A=received signal strength at one meter distance.

After completing act 309, the process may continue to act 311 where the process (knowing RSSI) may determine d as set forth by Equations (1) through (4) above.

In accordance with embodiments of the present system, the absolute distance d may be the only required variable that is needed to locate the MRF at one or more known locations.

Figure 3B:
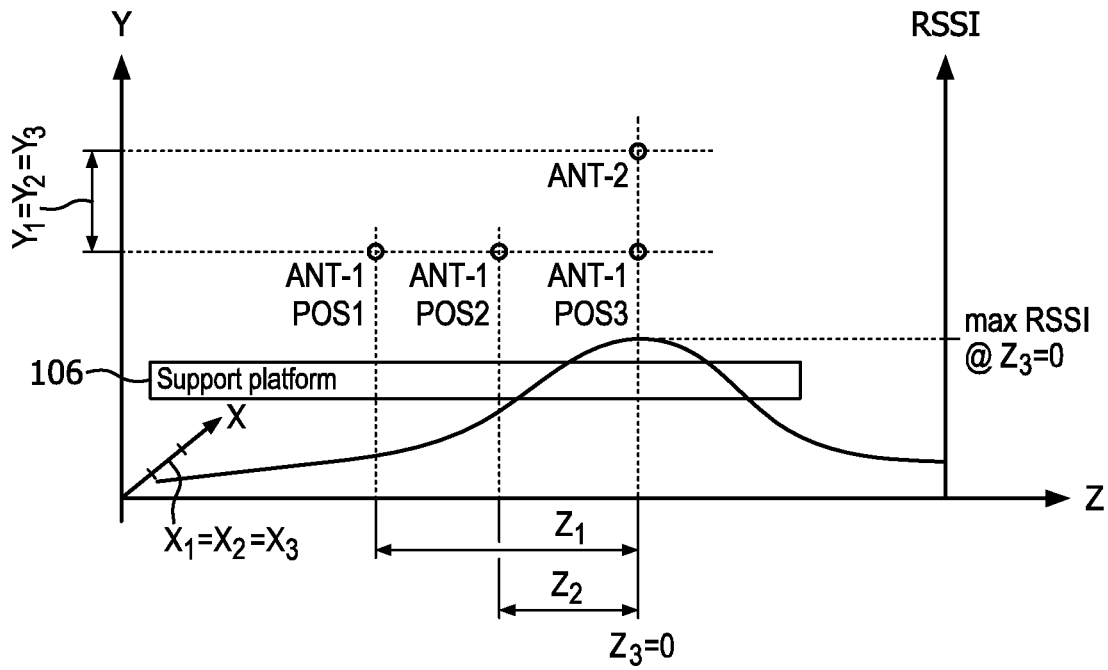
FIG. 3B shows a portion of a schematic block diagram of the MR system in accordance with embodiments of the present system.
Figure 3C:
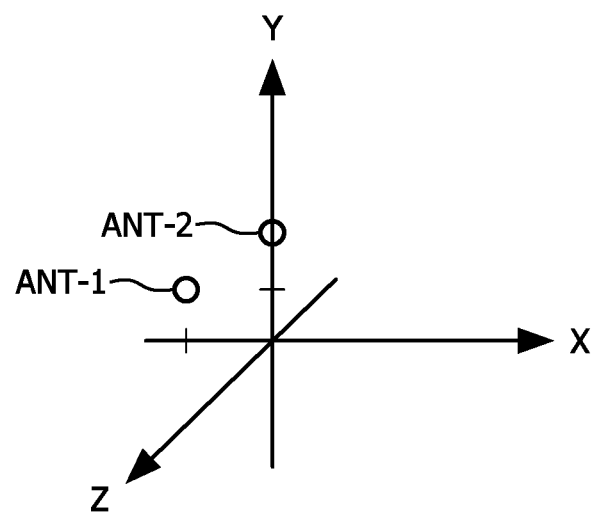
FIG. 3C illustrates a positioning of transmit and receive antennas within an X, Y and Z coordinate system in accordance with embodiments of the present system.

FIG. 3B shows a portion of a schematic block diagram of the system 100 including an embodiment illustrated to show details of an act which may the same or similar to the act 311 wherein d is determined in accordance with embodiments of the present system. The system 100 shows the support platform 106, the receive antenna ANT-2 and the transmit antenna ANT-1 illustratively at three locations POS1, POS2 and POS3. The receive antenna ANT-2 is shown located at a known position such as for example located substantially at an isocenter axis (ISO) of the main magnetic field (B0) of the system 100. As shown in FIG. 3B and in more detail in FIG. 3C, there is an X, Y and Z axis with the Z axis corresponding to the determined distance d. FIG. 3C shows the position of the receive antenna ANT-2 in relation to the transmit antenna ANT-1. Similar as discussed above, only a single transmit and receive antenna is shown for clarity and brevity, though more transmit and/or receive antennas may be similarly utilized.

Illustratively, the max RSSI is shown at the determined distance $d=Z_3$ with distances $Z_1$ and $Z_2$ shown as a distance from $Z_3$ (e.g., position zero, (0)).

As shown, the distances associated with the X and Y axis are illustratively equal (e.g., X1=X2=X3; Y1=Y2=Y3) at a plurality of known Z locations or changes on a prescribed known trajectory. By knowing the absolute distances di, the Xi and Yi distances may be determined for example as:

$$d(PL_{min}) = \sqrt{(Y_{min}^2 + X_{min}^2)}$$

$$d(PL_i) = \sqrt{(Y_{min}^2 + X_{min}^2 + Z_i^2)}$$

wherein:

d(PLmin) is the determined known distance for example calculated in act 311, with Ymin and Xmin the corresponding X and Y axis components of d at this position; and d(PLi) is the further known distance di (e.g., at location $Z_2$ and $Z_3$).

After determining d, the process may continue to act 313.

During act 311, the process may determine whether a location adjustment is necessary to align the transmit antenna (e.g., the transmit antenna of the MRF) with the isocenter axis (ISO). Accordingly, if it is determined that location adjustment is necessary to align the transmit antenna with the isocenter axis (ISO), the process may continue to act 315. However, if it is determined that location adjustment is not necessary to align the transmit antenna with the isocenter axis (ISO) (e.g., the transmit antenna is aligned with the isocenter axis (ISO), the process may continue to act 317.

During this act, the process may determine whether location adjustment is necessary using any suitable method. For example, the process may compare an absolute value of |d| with a corresponding threshold distance value Δd. Accordingly, if it is determined that the absolute value of |d| is greater than Δd, the process may determine that location adjustment is necessary. However, if it is determined that the absolute value of |d| is not greater than (e.g., is equal to or less than) Δd, the process may determine that location adjustment is not necessary.

During act 315, the process may adjust location of the MRF so that the transmit antenna (e.g., ANT-1) may be moved closer to the isocenter axis (ISO). The process may adjust the location of the MRF based upon the value of d. As the value of d may be positive only in embodiments of the present system, the process may begin the fine tuning process before the transmit antenna of the MRF passes the isocenter axis (ISO) so that the transmit antenna of the MRF may approach the isocenter axis (ISO) from one side. However, it is also envisioned that the process may use a bracketing method to zero-in on the isocenter axis (ISO) or by determining RSSI by location of the transmit antenna along the z axis relative to the isocenter axis (ISO) as described with reference to process 400 FIG. 4 below.

[ After completing act 315, the process may repeat acts such as starting again at act 307 and continuing through the acts as before.

During act 317, the process may perform a scan for the current MRF location. Accordingly, the process may transmit a scanning sequence and may acquire corresponding induced MR signals. Then, the acquired induced MR signals may be stored in a memory of the system, digitized, and/or reconstructed to form reconstructed MR image or spectrograph information. As the transmit antenna of the MRF may be considered at this time to be aligned with the isocenter axis (ISO), image quality of reconstructed images may be enhanced. In accordance with embodiments of the present system, the RSSI may be monitored during the scan for example to determine whether or not the MRF (124-2) is stationary during the scan. After completing act 317, the process may continue to act 319, where it may end.

Figure 4:
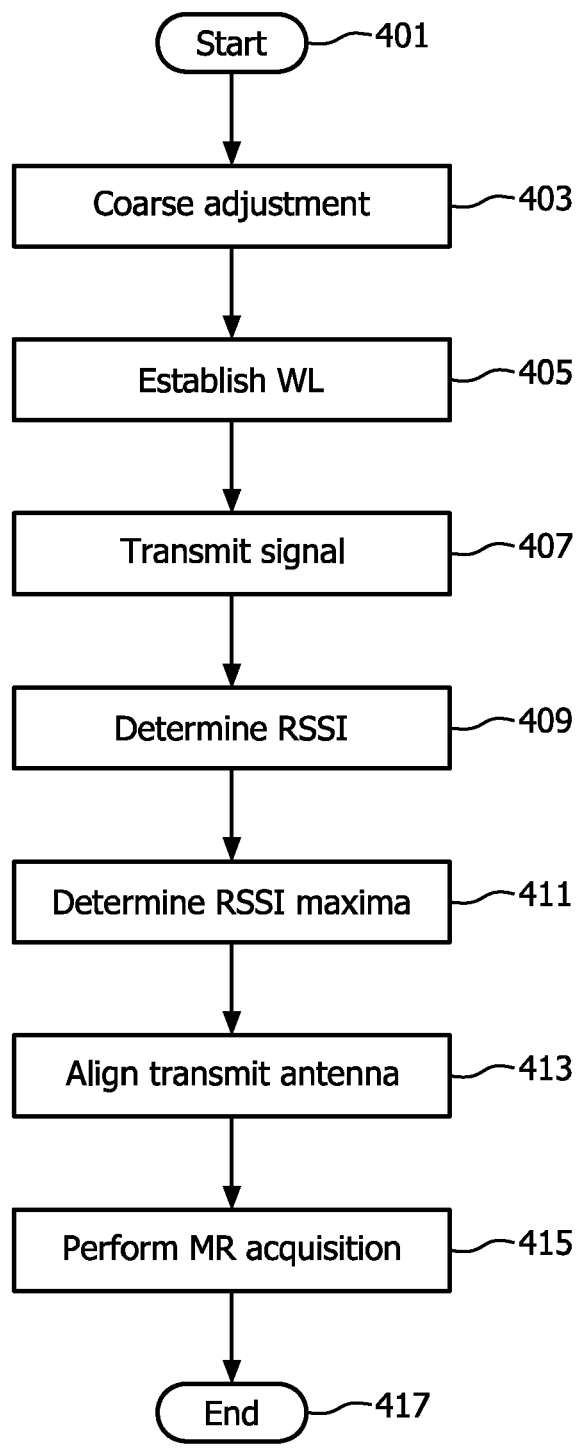
FIG. 4 shows a functional flow diagram of a process that may be performed in accordance with embodiments of the present system.

FIG. 4 shows a functional flow diagram of a process 400 that may be performed in accordance with embodiments of the present system. The process 400 may be performed using one or more computers communicating over a network and may obtain information from, and/or store information to one or more memories which may be local and/or remote from each other. The process 400 may include one of more of the following acts and may be operative to align antennas of a transmit/receive system of an MRI system that may include one or more of an MRF and BTS. Further, one or more of these acts may be combined and/or separated into sub-acts, if desired. Further, one or more of these acts may be skipped depending upon settings. In operation, the process may start during act 401 and then proceed to act 403.

During act 403, the process may perform a coarse adjustment operation to place a support platform in an initial location within a bore of a main magnet such that the MRF or portions thereof is near the isocenter axis (ISO). As this act may be similar to the act 303 of the process 300, for the sake of clarity, a further description thereof will not be provided. After completing act 403, the process may continue to act 405.

During act 405, the process may establish a wireless link (WL) communicatively coupling a wireless RF coil via an antenna of the RF coil ANT-2 (e.g., see, 124-2) to a BTS via an antenna of the BTS (e.g., ANT-2) located at a desired position such as at, or substantially at, an isocenter axis (ISO) of the main magnet. As this act may be similar to the act 305 of the process 300, for the sake of clarity, a further description thereof will not be provided. After completing act 405, the process may continue to act 407.

During act 407, the process may transmit a signal (e.g., a location signal) from transmit antenna (e.g., of an MRF) to the receive antenna (e.g., at the ISO) over the WL. This signal may be transmitted continuously or at desired times (e.g., each time a MRF is moved) throughout the remainder of the process. As this act may be similar to the act 305 of the process 300, for the sake of clarity, a further description thereof will not be provided. After completing act 407, the process may continue to act 409.

During act 409, the process may determine RSSI for a plurality (e.g., S, where S is an integer) of locations of the transmit antenna along an axis parallel to the z axis. These plurality of locations may extend over a range R which may have a start point $R_0$ and an end point $R_1$ so that R may be defined as $R=R_1-R_0$ along the z axis.

For example, the process may discretely advance (or retard) the transmitting antenna in a direction parallel to the z axis S times through the range R. At each discrete $s^{th}$ point of the S points, the process may determine RSSI for a location signal transmitted at the corresponding $s^{th}$ point. Thus, the process may determine RSSI for S points. Each of these S points may be separated from adjacent points by a distance dR=R/SN and may include a corresponding index number equal to a value of n at the point. Thus, each value of RSSI may be indexed with a corresponding $s^{th}$ point as RSSI(s) and may be associated with a corresponding point on the z axis.

Figure 5:
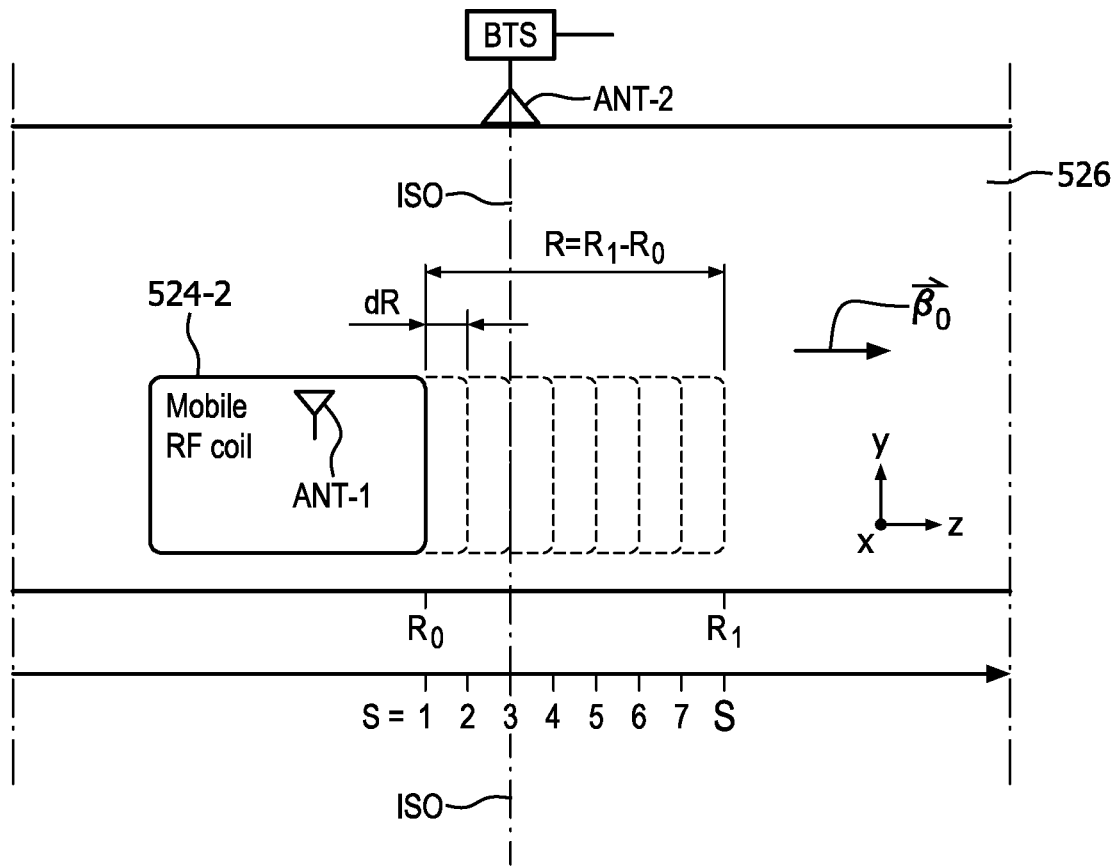
FIG. 5 shows detailed schematic block diagram of a portion of the MR system in accordance with embodiments of the present system.
Figure 5:
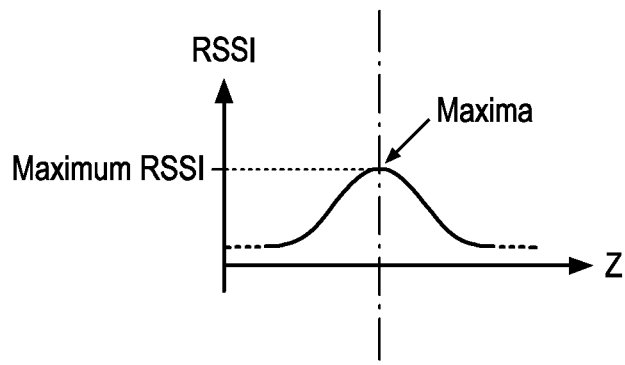

Thus, when the process increments the transmitting antenna (e.g. for each value of dR(s), the process may determine RSSI for a signal transmitted from the transmitting antenna (e.g., ANT-1) and received at a receiving antenna (e.g., ANT-2) as illustrated in FIG. 5 which shows an example of a detailed schematic block diagram of a portion of the MR system 500 in accordance with embodiments of the present system.

Referring to FIG. 5, an MRF 524-2 may include a transmit antenna ANT-1 which may transmit a signal received by a reception antenna ANT-2 that may be coupled to a BTS and which is mounted at a predetermined location such as at an isocenter axis (ISO) of a main magnet of the MRI system 500. The BTS may be coupled to a controller of the MRI system 500. For each value of s, the system controller may be operative increment a position of the transmit ANT-1 antenna using any suitable method (e.g., by moving a support platform, by controlling motion of the MRF 524-2 directly, and/or by controlling a position of the transmission antenna ANT-1 directly). For each $s^{th}$ position of the transmit antenna ANT-1 along a z axis, the process may determine a corresponding value of RSSI. The process may then store the value of RSSI in association with the corresponding index (e.g., s) and/or location along the z axis in a memory of the system for later use such as during act 413.

With regard to the variables R, S and dR, these values and/or ranges of values be set by a user and/or the system and/or may be stored in a memory of the system for later use. Moreover, these variables may be set depending upon a scan type (e.g., S=50 for a knee scan and S=100 for a head scan, etc.). Thus, the system and/or user may adjust these values to enhance MR image reconstruction as may be desired. Further, these values may be stored in accordance with user-preferred settings so that they may vary by user.

Increasing a value of N (or decreasing a value of dR) may increase accuracy and vice versa. However, as the value of dR decreases (or S increases), the process may require more time and resources to perform a scan. With respect to R, the value of R may be set such that within its range ($R_0$ and $R_1$) alignment of the transmit antenna with the reception antenna and therefore the isocenter axis (ISO) will most likely lie within the range of R. However, in yet other embodiments, R may be a subset of R'. After completing act 409, the process may continue to act 411. During act 411, the process may determine a maxima from the values of RSSI determined over the range R. This maxima may correspond with a maximum value of RSSI as shown in FIG. 5. The process may determine the maxima of RSSI using any suitable method such as a suitable numerical analysis method, etc.

In accordance with embodiments of the present system, acts 409 and 411 may be performed concurrently with each other such that once a maxima for RSSI is determined, the process may continue to act 413 to conserve system resources and time rather than continuing to determine further values of RSSI. Moreover, in accordance with embodiments of the present system, it is envisioned that the process may interpolate values for RSSI and/or a corresponding locations, if desired. After competing act 411, the process may continue to act 413.

During act 413, the process may align the transmit antenna with the receive antenna so that the transmit antenna may be aligned with the isocenter axis (ISO). This alignment may be performed by determining a position of the transmit antenna along the z axis at the maxima of the RSSI and setting the position of the transmit antenna to this determined position. After completing act 413, the process may continue to act 415.

During act 415, the process may perform an MR acquisition. This act may be similar to act 317 of the process 300. Accordingly, for the sake of clarity, a further description thereof will not be given. After completing act 415, the process may end.

Figure 6:
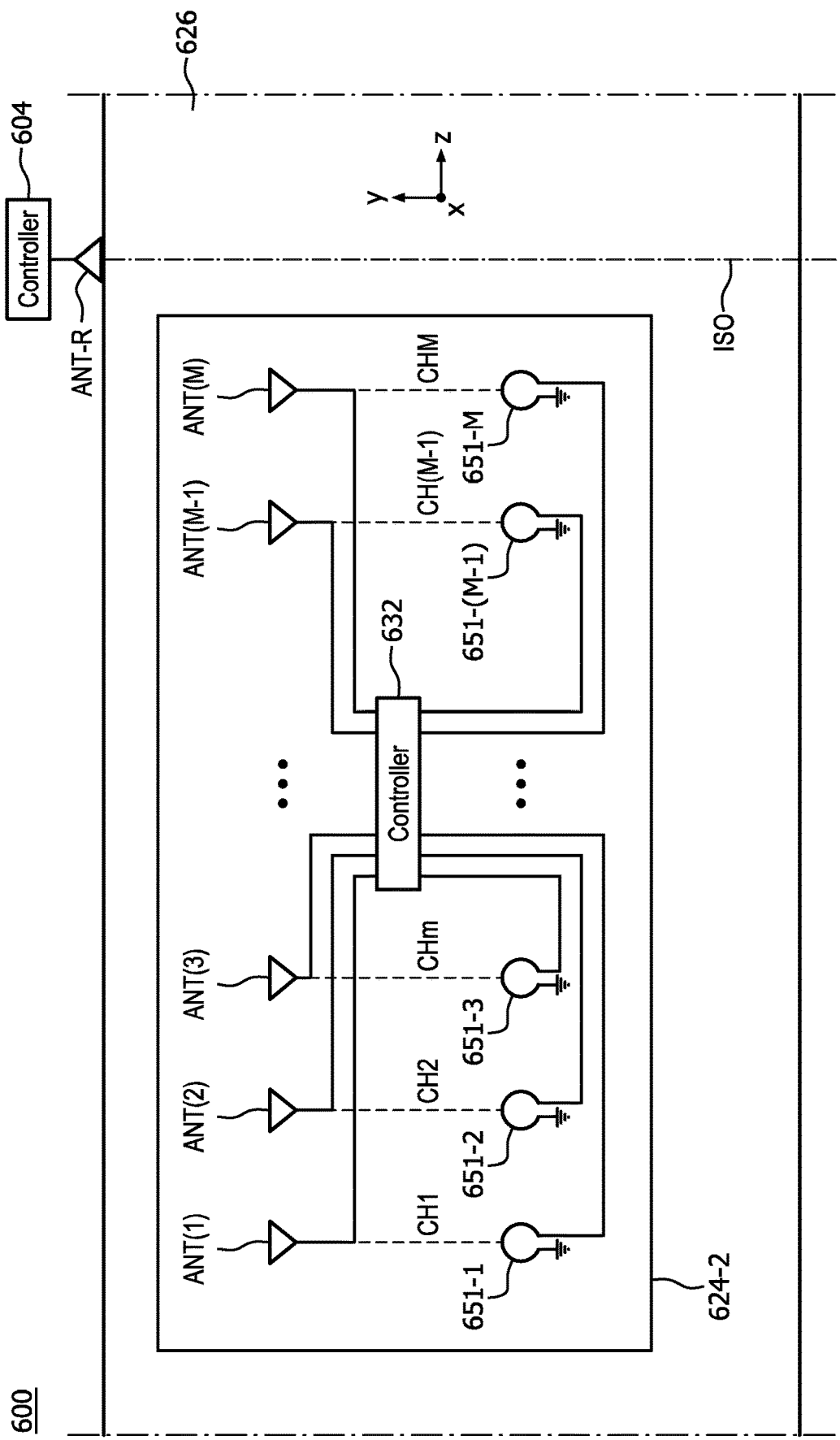
FIG. 6 shows a detailed schematic block diagram of a portion of an MR system in accordance with embodiments of the present system.

FIG. 6 shows a detailed schematic block diagram of a portion of an MR system 600 in accordance with embodiments of the present system. The system may be similar to the system 100 of FIG. 1 and may include an MRF 624-2 and a receive antenna ANT-R that may be similar to the MRF 124-2 and the receive antenna ANT-2, respectively, of FIG. 1. Accordingly, the receive antenna ANT-R may be situated at a predetermined location relative to a bore 626 of a main magnet of the MR system 600 such as at an isocenter axis (ISO) of the main magnet and may be coupled to a controller 604 of the MR system 600. However, the MRF 624-2 may include a plurality (e.g., M, where M is an integer) of transmit antennas ANT(1) through ANT(M) (generally ANT(x)) each of which may be selectively controlled to transmit a signal for alignment with a selected antenna such as the receive antenna ANT-R. For example, if it is determined to align ANT(1) with the receive antenna ANT-R, the controller may select ANT(1) to transmit a signal (e.g., a location signal) to the receive antenna ANT-R. Similarly, if an $m^{th}$ antenna is selected for alignment with the receive antenna ANT-R, the controller may select ANT(m) to transmit (e.g., a location signal) to the receive antenna ANT-R. The system may then align the selected antenna of the MRF with the receive antenna ANT-R.

For example, assuming the MRF 624-2 includes a plurality of channels CH such as channels 1 through M (e.g., CH1 through CHM), each channel being associated with a respective an antenna coil 651-1 through 651-M (generally 651-x). Each of the antenna coils 651-x may be tuned to receive induced MR signals from the 001 and may provide the received induced MR signal to the controller 623 for further processing such as for reconstruction into an image and/or spectrograph. Assuming that each of these antenna coils 651-x is aligned with a corresponding one of the transmit antennas ANT(x), then the process may align an $m^{th}$ selected antenna coils 651-m with the receive antenna ANT-R (and, thus, the isocenter axis (ISO)) by aligning the respective $m^{th}$ transmit antenna ANT(m) with the receive antenna ANT-R.

Thus, if the system determines to acquire induced MR signals on an $m^{th}$ channel such as CH2, the system may align ANT(2) with the receive antenna ANT-R in accordance with embodiments of the present system and may thereafter acquire the induced MR signal using the receive coil 651-2 of the corresponding $m^{th}$ channel (e.g., CH2 in the present embodiments). Thus, the system may selectively align a receive channel of a plurality of receive channels with a desired axis such as the isocenter axis before acquiring induced MR signals from the OOI. This may enhance MR spectrograph and/or image quality for MRFs employing multiple receive coils and/or channels.

Figure 7:
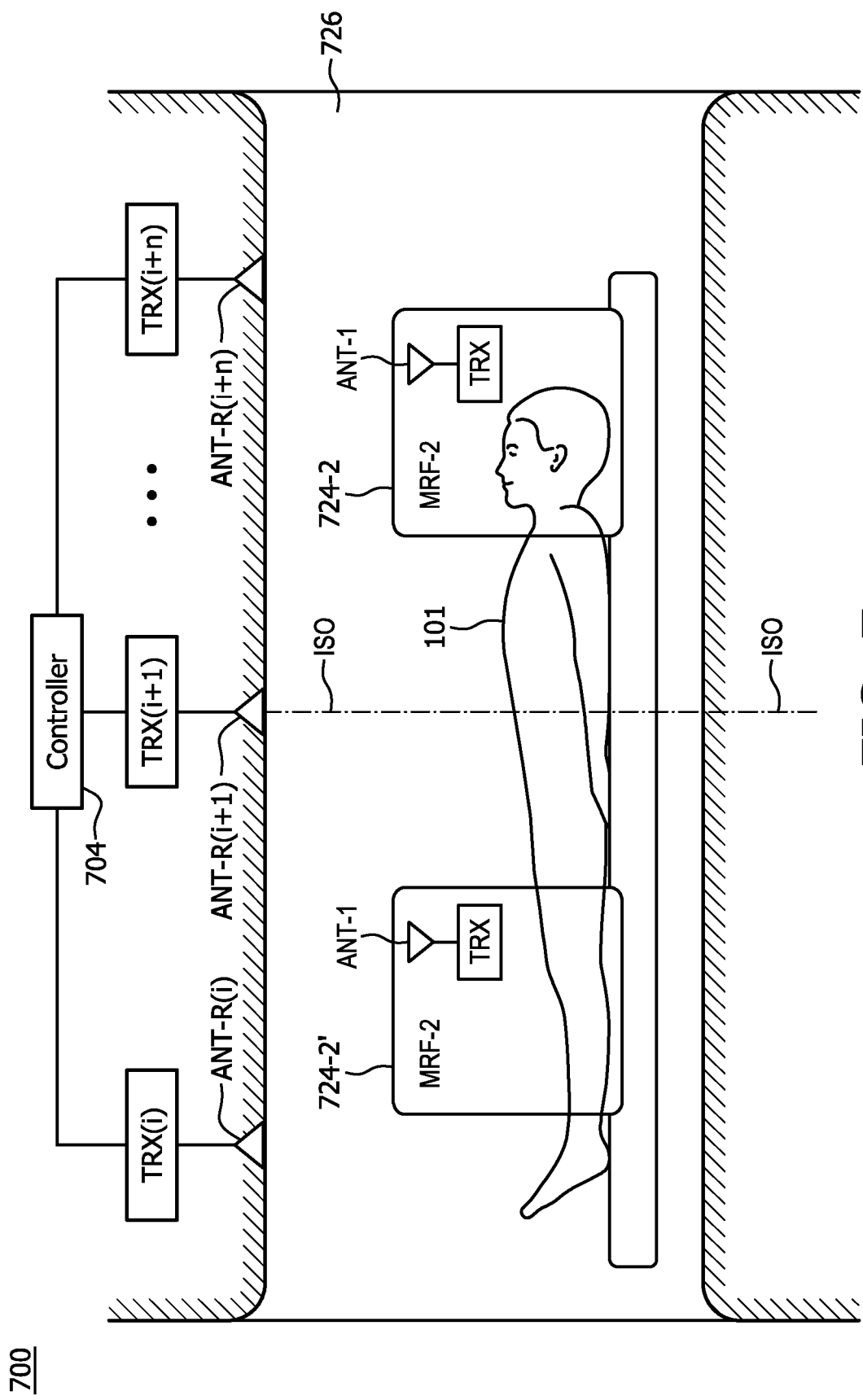
FIG. 7 shows a detailed schematic block diagram of a portion of an MR system in accordance with embodiments of the present system.

FIG. 7 shows a detailed schematic block diagram of a portion of an MR system 700 in accordance with embodiments of the present system. The system 700 may be similar to the system 100 of FIG. 1 and may include a system controller 704, an MRF 724-2, and a plurality of transmit and/or receive (TRX(i)) and corresponding receive antennas ANT-Ri where n equals the total number of wireless TRX with an RSSI function in accordance with embodiments of the present system. The system 700 may include a plurality of MRFs such as a second MRF 724-2' which may be similar to the MRF 724-2. However, in accordance with further embodiments of the present system the MRFs 724-1 and 724-2' may differ in a type of operation. For example, the MRF 724-2 may be a head coil and the MRF 724-2' may be a knee coil. Accordingly, the system controller 704 may select an MRF of the plurality of MRFs 742-2, 742-2' and may align one or more transmit antennas ANT-1 of the selected MRF with one or more of the receive antennas ANT-Ri and may thereafter perform one or more image acquisitions. The process may do this for each MRF 724-2, 724-2', etc., individually, one after another or during a similar or same time period (e.g., simultaneously or substantially simultaneously) so that a transmit antenna of each selected MRF may be aligned with one or more of the receive antennas ANT-Ri and, thus, one or more of known locations of the receive antennas ANT-Ri, such as the isocenter axis (ISO) and/or other one or more known locations.

Accordingly, a patient may be fitted with a plurality of MRFs before entering a bore 726 of an MRI system for MR imaging using the plurality of MRFs. This may save precious time especially when time is of the essence such as when a patient is injured.

Figure 8:
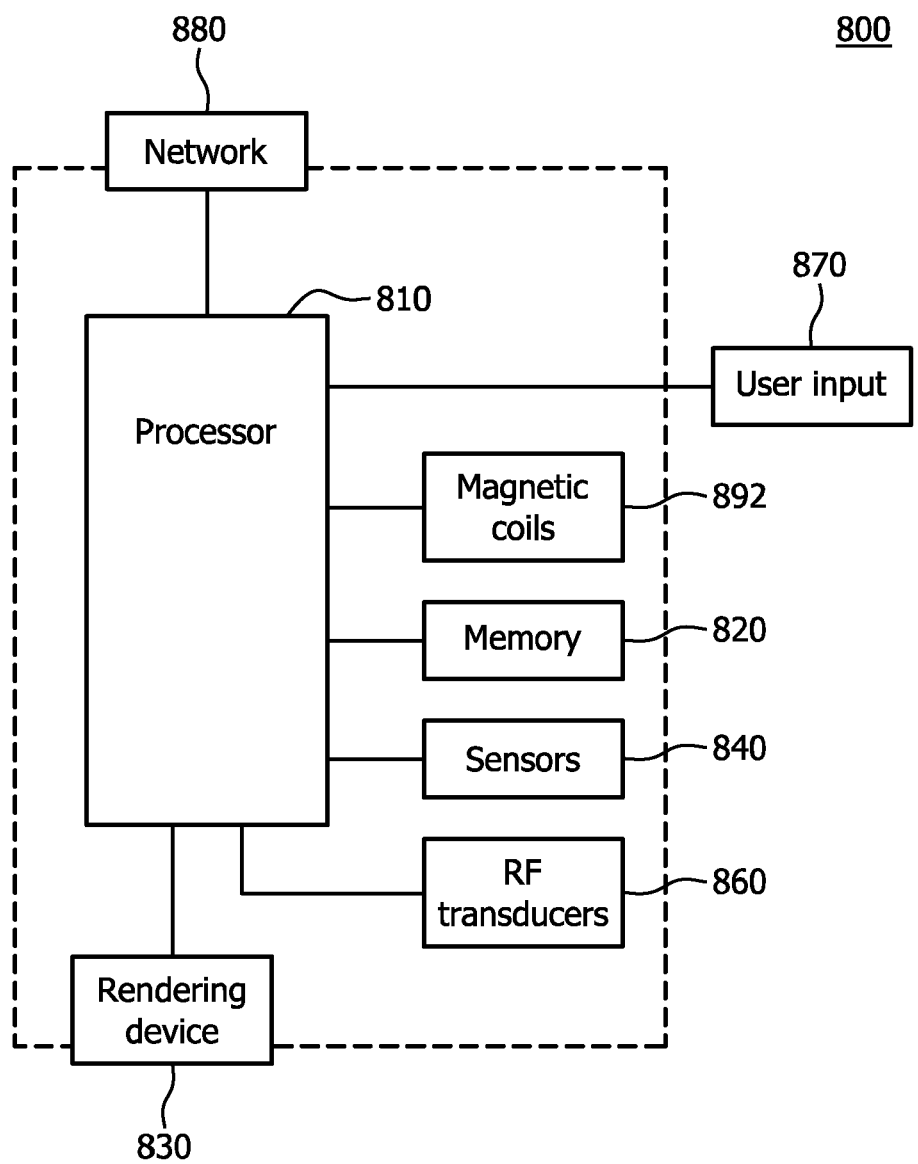
FIG. 8 shows a portion of a system in accordance with embodiments of the present system.

FIG. 8 shows a portion of a system 800 in accordance with embodiments of the present system. For example, a portion of the present system may include a processor 810 (e.g., a controller) operationally coupled to a memory 820, a rendering device such as a display 830, sensors 840, RF portion 860, magnetic coils 892, and a user input device 870. The memory 820 may be any type of device for storing application data as well as other data related to the described operation. The application data and other data are received by the processor 810 for configuring (e.g., programming) the processor 810 to perform operation acts in accordance with the present system. The processor 810 so configured becomes a special purpose machine particularly suited for performing in accordance with embodiments of the present system.

The operation acts may include configuring an MRI system by, for example, controlling optional support actuators, the magnetic coils 892, and/or the RF portion 860. The support actuators may control a physical location (e.g., in x, y, and z axes) of a patient, if desired. The RF portion 860 may be controlled by the processor 810 to control RF transducers such as one or more RF transmission coils and/or one or more RF reception coils, and RF states (modes) such as tune/detune and synchronization states. The magnetic coils 892 may include main magnetic coils, gradient coils (e.g., x-, y-, and z-gradient coils), optional shimming coils, and may be controlled to emit a main magnetic field and/or gradient fields in a desired direction and/or strength. The controller may control one or more power supplies to provide power to the magnetic coils 892 so that a desired magnetic field is emitted at a desired time. The RF portion 860 may be controlled to transmit RF pulses at the patient using during a detune state and/or to receive echo information therefrom during a tune state. A reconstructor may process received signals such as the (MR) echo information and transform them (e.g., using one or more reconstruction techniques of embodiments of the present system) into content which may include image information (e.g., still or video images (e.g., video information)), data, and/or graphs that can be rendered on, for example, a user interface (UI) of the present system such as on the display 830, a speaker, etc. Further, the content may then be stored in a memory of the system such as the memory 820 for later use. Thus, operation acts may include requesting, providing, and/or rendering of content such as, for example, reconstructed image information obtained from the echo information. The processor 810 may render the content such as video information on a UI of the system such as a display of the system. A synchronization portion may synchronize a clock of the RF portion 860 with a system clock.

The user input 870 may include a keyboard, a mouse, a trackball, or other device, such as a touch-sensitive display, which may be stand alone or be a part of a system, such as part of a personal computer, a personal digital assistant (PDA), a mobile phone (e.g., a smart phone), a monitor, a smart- or dumb-terminal or other device for communicating with the processor 810 via any operable link. The user input device 870 may be operable for interacting with the processor 810 including enabling interaction within a UI as described herein. Clearly the processor 810, the memory 820, display 830, and/or user input device 870 may all or partly be a portion of a computer system or other device such as a client and/or server.

The methods of the present system are particularly suited to be carried out by a computer software program, such program containing modules corresponding to one or more of the individual steps or acts described and/or envisioned by the present system. Such program may of course be embodied in a computer-readable medium, such as an integrated chip, a peripheral device or memory, such as the memory 820 or other memory coupled to the processor 810.

The program and/or program portions contained in the memory 820 may configure the processor 810 to implement the methods, operational acts, and functions disclosed herein. The memories may be distributed, for example between the clients and/or servers, or local, and the processor 810, where additional processors may be provided, may also be distributed or may be singular. The memories may be implemented as electrical, magnetic or optical memory, or any combination of these or other types of storage devices. Moreover, the term "memory" should be construed broadly enough to encompass any information able to be read from or written to an address in an addressable space accessible by the processor 810. With this definition, information accessible through a network is still within the memory, for instance, because the processor 810 may retrieve the information from the network for operation in accordance with the present system.

The processor 810 is operable for providing control signals and/or performing operations in response to input signals from the user input device 870 as well as in response to other devices of a network and executing instructions stored in the memory 820. The processor 810 may include one or more of a microprocessor, an application-specific or general-use integrated circuit(s), a logic device, etc. Further, the processor 810 may be a dedicated processor for performing in accordance with the present system or may be a general-purpose processor wherein only one of many functions operates for performing in accordance with the present system. The processor 810 may operate utilizing a program portion, multiple program segments, or may be a hardware device utilizing a dedicated or multi-purpose integrated circuit.

While the present invention has been shown and described with reference to particular exemplary embodiments, it are understood by those skilled in the art that present invention is not limited thereto, but that various changes in form and details, including the combination of various features and embodiments, may be made therein without departing from the spirit and scope of the invention.

Further variations of the present system would readily occur to a person of ordinary skill in the art and are encompassed by the following claims.

Finally, the above-discussion is intended to be merely illustrative of the present system and should not be construed as limiting the appended claims to any particular embodiment or group of embodiments. Thus, while the present system has been described with reference to exemplary embodiments, it should also be appreciated that numerous modifications and alternative embodiments may be devised by those having ordinary skill in the art without departing from the broader and intended spirit and scope of the present system as set forth in the claims that follow. In addition, the section headings included herein are intended to facilitate a review but are not intended to limit the scope of the present system. Accordingly, the specification and drawings are to be regarded in an illustrative manner and are not intended to limit the scope of the appended claims.

Accordingly, the specification and drawings are to be regarded in an illustrative manner and are not intended to limit the scope of the appended claims.

In interpreting the appended claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) several "means" may be represented by the same item or hardware or software implemented structure or function;

e) any of the disclosed elements may be comprised of hardware portions (e.g., including discrete and integrated electronic circuitry), software portions (e.g., computer programming), and any combination thereof;

f) hardware portions may be comprised of one or both of analog and digital portions;

g) any of the disclosed devices or portions thereof may be combined together or separated into further portions unless specifically stated otherwise;

h) no specific sequence of acts or steps is intended to be required unless specifically indicated;

i) the term "plurality of" an element includes two or more of the claimed element, and does not imply any particular range of number of elements; that is, a plurality of elements may be as few as two elements, and may include an immeasurable number of elements; and j) the term and/or and formatives thereof should be understood to mean that only one or more of the listed elements may need to be suitably present in the system in accordance with the claims recitation and in accordance with one or more embodiments of the present system.

The invention claimed is:

1. A magnetic resonance (MR) system, comprising:
a main magnet having a bore and producing a substantially homogenous magnetic field (B0) within a scanning volume;
a mobile radio-frequency (RF) coil (MRF) including at least one transmit antenna for transmitting a location signal within the bore of the magnet, wherein the location signal is an RF signal that includes image information of a current scan;

at least one receive antenna situated substantially at a known location, the receive antenna configured to receive the transmitted location signal; and a controller configured to determine a receive signal strength (RSSI) of the received location signal and align the transmit antenna of the MRF with reference to the known location of the receive antenna during the current scan based upon the determination of the RSSI.

2. The MR system of claim 1, wherein the controller further comprises at least one base transceiver system (BTS) each coupled to corresponding ones of the at least one receive antenna.

3. The MR system of claim 1, wherein the controller is further configured to determine a distance (d) between the transmit antenna and the receive antenna.

4. The MR system of claim 3, wherein the receive antenna is situated substantially at an isocenter axis (ISO) of the scanning volume and the controller is further configured to control at least one actuator of a support portion to locate the transmit antenna substantially on the ISO based upon the determined distance (d).

5. The MR system of claim 1, wherein the receive antenna is situated substantially at an isocenter axis (ISO) of the scanning volume and the controller is further configured to determine the receive signal strength (RSSI) for each of a plurality of positions of the transmit antenna along a z axis perpendicular or substantially perpendicular to the ISO.

6. The MR system of claim 5, wherein the controller is further configured to determine, for the plurality of positions of the transmitting antenna, a maxima of the RSSI.

7. The MR system of claim 6, wherein the controller is further configured to determine a position along the z axis that corresponds with the RSSI at the maxima.

8. The MR system of claim 7, wherein the controller is further configured to control at least one actuator of a support portion to locate the transmit antenna substantially on the ISO.

9. The MR system of claim 1, further including:
a gradient magnetic field coil configured to generate magnetic field gradients in the $B_0$ field within the scanning volume;
a transmit/receive coil (TRX) stationarily mounted relative to the scanning volume;
wherein the controller is further configured to:
control the gradient magnetic field coil and the TRX coil to excite magnetic resonance in a portion of a subject in the scan volume,
receive magnetic resonance signals received by the MRF, and
reconstruct the received magnetic resonance signals into an image of the portion of the subject;
wherein the receive antenna is different from the TRX coil and the location signal is different from the magnetic resonance signal.

10. The MR system according to claim 1, wherein the MRF is configured to receive magnetic resonance signals from the scanning volume and convey the received magnetic resonance signals to the controller for reconstruction into an image, wherein the location signal is different from the magnetic resonance signals.

11. A method of operating a magnetic resonance (MR) system, the method comprising:
producing a substantially homogenous magnetic field $(B_0)$ within a scanning volume of a bore;
with a mobile radio-frequency (RF) coil (MRF) including at least one transmit antenna, transmitting a location signal within the bore;

receiving the transmitted location signal with at least one receive antenna situated substantially at a known location relative to the scanning volume;
determine by a controller a receive signal strength (RSSI) of the location signal received by the receive antenna;
aligning by the controller the transmit antenna of the MRF with reference to the known location of the receive antenna using the RSSI;
when the transmit antenna of the MRF is aligned with reference to the known location, exciting magnetic resonance in the scanning volume adjacent the MRF;
with the transmit antenna of the MRF aligned with reference to the known location, receiving magnetic resonance signals from the scanning volume with the MRF; and
reconstructing the received magnetic resonance signals into an image of the portion of a subject disposed in the scanning volume,
wherein the location signal is different from the magnetic resonance signals and the transmit and receive antennas are different from magnetic resonance transmitting or receiving coils.

12. The method of claim 11, comprising determining by the controller a distance (d) between the transmit antenna and the receive antenna.

13. The method of claim 12, wherein the receive antenna is situated substantially at an isocenter axis (ISO) of the scanning volume, the method further including controlling at least one actuator of a support portion to locate the transmit antenna substantially on the ISO based upon the determined distance (d).

14. The method of claim 11, wherein the receive antenna is situated substantially at an isocenter axis (ISO) of the scanning volume, the method comprising an act of determining by the controller the receive signal strength (RSSI) for a plurality of positions of the transmit antenna along a longitudinal axis of the bore.

15. The method of claim 14, comprising determining by the controller a maxima of the RSSI for the plurality of positions of the transmitting antenna along the longitudinal axis.

16. The method of claim 15, comprising determining by the controller a position along the longitudinal axis that corresponds with the RSSI maxima.

17. The method of claim 16, comprising with the controller controlling at least one actuator of a support portion to locate the transmit antenna substantially at the determined position, wherein the magnetic resonance is excited and the magnetic resonance signals are received at the determined location.

18. A computer program stored on a computer readable non-transitory memory medium for a magnetic resonance (MR) system including a main magnet having a bore and producing a substantially homogenous magnetic field $(B_0)$ at an isocenter axis (ISO) within a scanning volume, the computer program comprising computer program instructions that when executed by a processor cause the processor to perform a method comprising acts of:
transmitting by a mobile radio-frequency (RF) coil (MRF) including at least one transmit antenna a location signal within the bore, wherein the location radio frequency signal includes image information of a current scan;
receiving by at least one receive antenna situated substantially on the ISO the transmitted location signal; and
determine by the processor a receive signal strength (RSSI) of the received location signal during the current scan and aligning the transmit antenna of the MRF with reference to the ISO using the RSSI, wherein the location signal is different from an MR signal.

19. The computer program of claim 18, comprising determining a distance (d) between the transmit antenna and the receive antenna.

20. The computer program of claim 19, the method comprising:
- determining a receive signal strength (RSSI) along a longitudinal axis of the bore;
- determining a position along the longitudinal axis that corresponds with the RSSI maxima; and
- controlling at least one actuator of a support portion to move the transmit antenna to the determined position.

* * * * *